United States Patent [19]

Baba et al.

[11] Patent Number: 4,680,734
[45] Date of Patent: Jul. 14, 1987

[54] SEMICONDUCTOR MEMORY DEVICE

[75] Inventors: Fumio Baba, Kawasaki; Yoshihiro Takemae, Tokyo, both of Japan

[73] Assignee: Fujitsu Limited, Kawasaki, Japan

[21] Appl. No.: 762,531

[22] Filed: Aug. 5, 1985

[30] Foreign Application Priority Data

Aug. 11, 1984 [JP] Japan .................. 59-167276

[51] Int. Cl.[4] .................................. G11C 7/00
[52] U.S. Cl. ........................ 365/190; 365/149
[58] Field of Search ............ 365/149, 189, 190, 202, 365/207, 208, 218

[56] References Cited

U.S. PATENT DOCUMENTS 4,386,419  5/1983  Yamamoto .................. 365/190 X
4,479,202 10/1984  Uchida ........................ 365/190

OTHER PUBLICATIONS

K. S. Gray et al., "Block Erase for One-Device Cell Memory Arrays", IBM Technical Disclosure Bulletin, vol. 20, No. 5, Oct. 1977, pp. 1716-1717.

Primary Examiner—Joseph A. Popek
Attorney, Agent, or Firm—Staas & Halsey

[57] ABSTRACT

A semiconductor memory device having a data inverting circuit for selectively inverting an input/outpt data of a sense amplifier in such a way that the charging states of respective memory cells connected to two bit lines in each bit line pair become equal for the same input/output data. A clamp circuit draws the potentials of all of the bit lines to a predetermined potential in response to a clear control signal, whereby the contents of all of the memory cells are cleared at the same time.

12 Claims, 4 Drawing Figures

4,680,734

SEMICONDUCTOR MEMORY DEVICE

BACKGROUND OF THE INVENTION (1) Field of the Invention

The present invention relates to a semiconductor memory device. More particularly, it relates to a dynamic random access memory provided with a means for clearing the stored data of all bits at the same time.

(2) Description of the Related Art

In general, data stored in memory devices and used in, for example, a graphic display system or in a computer system which requires initialization must be quickly cleared at the same time.

Conventionally, in a dynamic random access memory, when the memory cells of all bits are to be cleared, data "0" is written by sequentially specifying addresses for respective memory cells.

However, such a conventional technique is disadvantageous in that a long time is necessary for clearing all the bits. In addition, a special circuit device or a program is necessary for providing the addresses of the memory cells to be sequentially cleared to the memory device.

Further, in a conventional dynamic random access memory, for the same input/output data, for example, "0", the memory cells on one side of the memory cell arrays with respect to sense amplifiers represent discharged states, and the memory cells on the other side of the memory cell arrays with respect to sense amplifiers represent charged states. That is, for the same input/output data, the one half of the memory cells do not store charges while the other half of the memory cells do store charges, and vice versa. In other words, the charging states of the memory cells for the same input/output data are different. Therefore, to clear all bits of the memory cells, that is, to input the same data "0" into all of the memory cells, one half of the memory cells should be discharged and the other half of the memory cells should be charged. The discharge of a number of memory cells at the same time on one side of the memory cell array is relatively easy. However, it is impractical to charge a number of memory cells at the same time on the other side of the memory cell array, because the charging of the memory cells requires a number of large power pull-up transistors, which disadvantageously occupy a large area and consume a large amount of electric power.

SUMMARY OF THE INVENTION

In view of the above-mentioned problems in the conventional type of memory device, an object of the present invention is to provide a semiconductor memory device which clears the memory cells of all bits at substantially the same time and with a small power consumption by employing a very simple circuit.

To attain the above object, according to the present invention, there is provided a semiconductor memory device comprising a plurality of bit-line pairs and a plurality of memory cells connected to bit lines constituting respective bit-line pairs. A plurality of sense amplifiers are provided, each sense amplifier corresponding to one bit-line pair and each having a pair of complementary signal terminals connected to the bit lines of the corresponding bit-line pairs. A pair of data buses inputs and outputs data to and from a selected bit-line pair. A data inverting circuit is operatively connected to the pair of data buses for selectively inverting an input/output data in such a way that the charging states of respective memory cells connected to the two bit lines of each bit-line pair become equal for the same input/output data. A clamp circuit is provided for drawing the potentials of all of the bit lines to a predetermined potential in response to a control signal applied when the contents of all of the memory cells are to be cleared.

By employing the above-mentioned device of the present invention between two bit lines arranged for inputting a complementary signal to a sense amplifier, the charging states of respective memory cells connected to the respective bit lines become equal for the same input/output data. Therefore, by clamping the potentials of all the bit lines to ground by means of transistors and so forth, the operation for clearing the memory cells of all bits is carried out rapidly and completely.

BRIEF DESCRIPTION OF THE DRAWINGS

The above object and features of the present invention will be more apparent from the following description of the preferred embodiment with reference to the drawings, wherein.

DESCRIPTION OF THE PREFERRED EMBODIMENT

Figure 1:
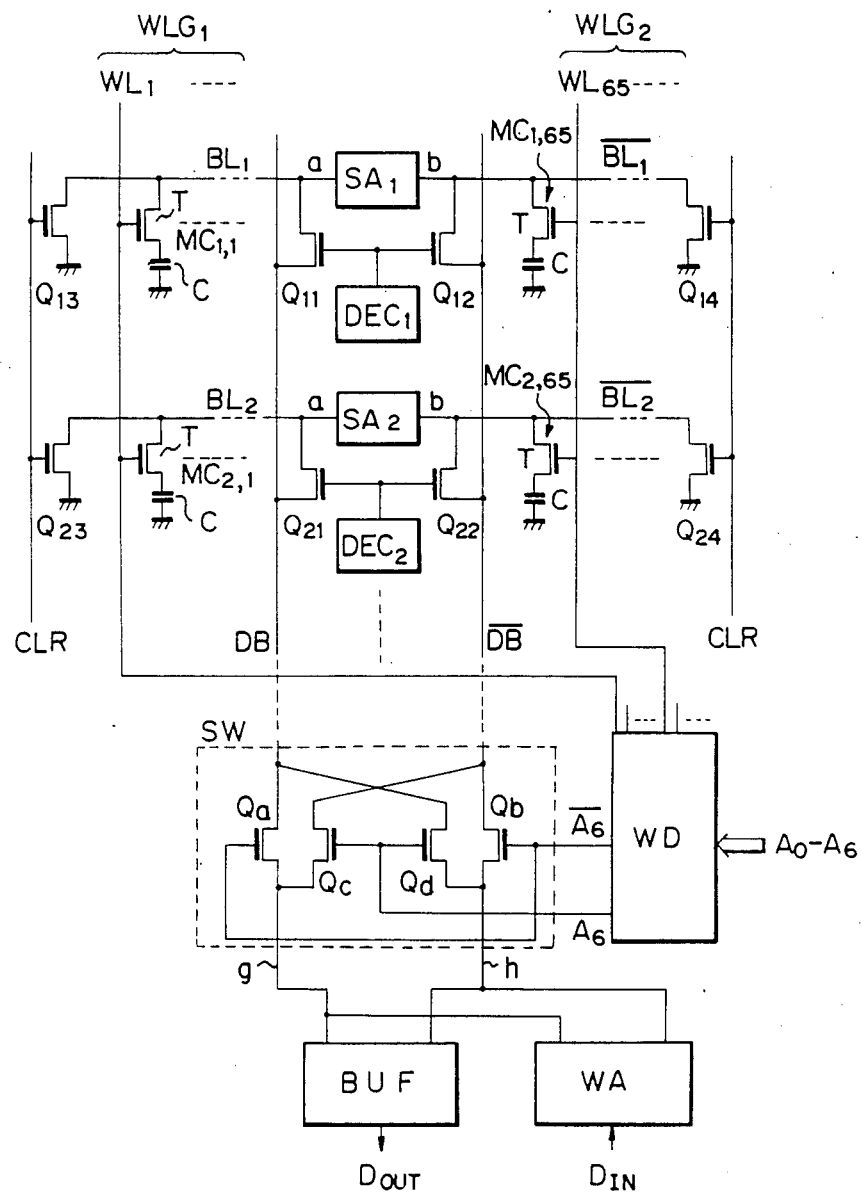
FIG. 1 is a block circuit diagram of the construction of a semiconductor memory device according to an embodiment of the present invention.

FIG. 1 is a dynamic random access memory as a semiconductor memory device according to an embodiment of the present invention. The memory device in FIG. 1 is constructed basically by sense amplifiers $SA_1$, $SA_2$, ..., bit lines $BL_1$, $\overline{BL_1}$, $BL_2$, $\overline{BL_2}$, ... connected to complementary input/output terminals a and b of these respective sense amplifiers $SA_1$, $SA_2$, ..., word lines $WL_1$, ..., $WL_{65}$, ..., and memory cells $MC_{1,1}$, ..., $MC_{1,65}$, ..., $MC_{2,1}$, ..., $MC_{2,65}$, ..., arranged at the intersecting portions of the respective bit lines and word lines. Each memory cell is constructed by one MIS transistor T and a capacitor C. The gate and the source (or drain) of the MIS transistor T are respectively connected to a corresponding word line and bit line. A pair of data buses DB and $\overline{DB}$ is arranged at both sides of the respective sense amplifiers $SA_1$, $SA_2$, .... Between these data buses DB and $\overline{DB}$ and the bit lines $BL_1$, $\overline{BL_1}$; $BL_2$, $\overline{BL_2}$; ... pairs of transistors $Q_{11}$, $Q_{12}$; $Q_{21}$, $Q_{22}$; ... respectively controlled by column decoders $DEC_1$, $DEC_2$, ... are connected. Between respective data buses DB and $\overline{DB}$ and an output buffer circuit BUF and write-in amplifier WA, a data inverting circuit having four transistors $Q_a$, $Q_b$, $Q_c$, and $Q_d$ is connected as illustrated in the figure.

One of the word lines $WL_1$, ..., $WL_{65}$, ..., and $WL_{128}$ (FIG.2) is selected by a word decoder WD in response to address signals $A_0$ through $A_6$.

The output buffer circuit BUF has two inputs, for receiving complementary signals, connected to nodes g and h, respectively. The output buffer circuit BUF provides an output data $D_{out}$ of "1" when the input connected to the node g is at the high level and the input connected to the node h is at the low level. The output buffer circuit BUF provides an output data $D_{out}$ of "0" when the inputs connected to the nodes g and h are at the low level and at the high level, respectively.

The write-in amplifier WA has two outputs, for providing complementary signals, connected to the nodes g and h, respectively. When the input data $D_{IN}$ is "1", the output connected, respectively, to the node g becomes high level and the output connected to the node h becomes low level. When the input data $D_{IN}$ is "0", the output connected to the node g becomes low level and the output connected to the node h becomes high level.

The transistors $Q_a$ and $Q_b$ are connected respectively between the data bus DB and the node g and between the data bus $\overline{DB}$ and the node h. The transistors $Q_c$ and $Q_d$ are connected, respectively, between the data bus DB and the node g and between the data bus $\overline{DB}$ and the node h. Each of these transistors $Q_a$, $Q_b$, $Q_c$, and $Q_d$ is controlled by a pair of complementary signals $A_6$ and $\overline{A}_6$ output from the word decoder WD. The transistors $Q_a$ and $Q_b$ are simultaneously turned ON or OFF by, for example, a signal $\overline{A}_6$ which is an inverted signal of the most-significant bit address signal $A_6$ for selecting a word line. The transistors $Q_c$ and $Q_d$ are simultaneously turned ON or OFF by the address signal $A_6$. When the transistors $Q_a$ and $Q_b$ are ON and the transistors $Q_c$ and $Q_d$ are OFF, the data buses DB and $\overline{DB}$ are connected to the nodes g and h through a straight connection. Conversely, when the transistors $Q_a$ and $Q_b$ are OFF and the transistors $Q_c$ and $Q_d$ are ON, the data buses DB and $\overline{DB}$ are connected to the nodes h and g through a cross connection. Further, in the memory device of FIG. 1, clamping transistors $Q_{13}$, $Q_{14}$, $Q_{23}$, $Q_{24}$, ... are connected between respective bit lines $BL_1$, $\overline{BL}_1$, $BL_2$, $\overline{BL}_2$, ... and ground. To clear all of the memory cells $MC_{1,1}$,..., $MC_{1,65}$,..., $MC_{2,1}$,..., $MC_{2,65}$, ..., a clear signal CLR is applied to the gates of transistors $Q_{13}$, $Q_{14}$, $Q_{23}$, $Q_{24}$, ....

The operation of the memory device having the above construction will now be described. During a writing operation, a word line, for example, $WL_1$, is selected by the word decoder WD, which receives address signals $A_0$ through $A_6$, so that all the memory cells $MC_{1,1}$, $MC_{2,1}$, .... connected to the word line $WL_1$ are turned ON. Also, the output of one column decoder, for example, $DEC_1$, is raised to a high level by a column address signal so that the transistors $Q_{11}$ and $Q_{12}$ are both turned ON and the bit lines $BL_1$ and $\overline{BL}_1$ are respectively connected through the transistors $Q_{11}$ and $Q_{12}$ to the data buses DB and $\overline{DB}$. Also, the switch circuit SW receives the most-significant bit address signal $A_6$ and its inverted signal $\overline{A}_6$ which are applied respectively to the gates of the transistors $Q_a$, $Q_b$ and $Q_c$, $Q_d$. Assuming that the address signal $A_6$ is at a low level, that is "0", then the inverted address signal $\overline{A}_6$ becomes a high level so that the transistors $Q_a$ and $Q_b$ are turned ON. In this state, an input data $D_{IN}$ is changed in the write-in amplifier WA to complementary signals. The complementary signals are input through the transistors $Q_a$ and $Q_b$ to the data buses DB and $\overline{DB}$. The complementary write-in signals input to the data buses DB and $\overline{DB}$ are transferred through the transistors $Q_{11}$ and $Q_{12}$ to the bit lines $BL_1$ and $\overline{BL}_1$. Assuming that the input data $D_{IN}$ is, for example, "1", and that the node g becomes a high level, then the data bus DB, and accordingly, the bit line $BL_1$ becomes a high level. Thus, positive charges are stored in the capacitor C of the memory cell $MC_{1,1}$ connected to the word line $WL_1$ and the bit line $BL_1$, and a data "1" is stored. As a result, the memory cell $MC_{1,1}$ for the input data "1" in the charged state. Note that, in FIG. 1, there are 64 word lines on each side of the sense amplifiers $SA_1$, $SA_2$, ...; one of the 64 word lines in each word-line group is selected by the six-bit address signals $A_0$, ..., $A_5$, and one of the two word-line groups $WLG_1$ and $WLG_2$, each having 64 word lines, is selected by the most-significant bit address signal $A_6$. Accordingly, in the above-mentioned operation, when the most-significant bit address $A_6$ is "0", the left side word-line group $WLG_1$ including the word line $WL_1$ is selected. Note, when the address $A_6$ is "1", the right side word-line group $WLG_2$ including the word line $WL_{65}$ is selected. In the latter case, when the word line $WL_{1,65}$ is selected, a write operation is effected for the memory cell $MC_{1,65}$ connected to the word line $WL_{65}$ and the bit line $\overline{BL}_1$. Also, in this case, when the input data $D_{IN}$ is equal to "1", the transistors $Q_a$ and $Q_b$ are turned OFF and the transistors $Q_c$ and $Q_d$ are turned ON, thus the data bus DB becomes a low level and the data bus $\overline{DB}$ becomes a high level. Therefore, the capacitor C of the memory cell $MC_{1,65}$ connected to the word line $WL_{65}$ and the bit line $\overline{BL}_1$ is also in the charged state for the input data "1". That is, in the memory device of FIG. 1, the charging states of the memory cells arranged on both sides of the sense amplifier series $SA_1$, $SA_2$, ... become the same for the same write-in data.

Also, to read data, one word line, for example, $WL_1$, is selected in response to the high level of the inverted signal $\overline{A}_6$; and then the potential difference between the bit lines $BL_1$ and $\overline{BL}_1$, generated in accordance with the storing state of the memory cell $MC_{1,1}$ connected to the bit line $BL_1$ and a reference voltage on the bit line $\overline{BL}_1$ generated by, for example, a well-known dummy cell circuit (not shown), is amplified by the sense amplifier $SA_1$. Subsequently, an output of one column decoder, for example, $DEC_1$, becomes a high level in accordance with a column address signal so that the transistors $Q_{11}$ and $Q_{12}$ are turned ON to connect the bit lines $BL_1$ and $\overline{BL}_1$ with the data buses DB and $\overline{DB}$. Thus, the output of the sense-amplifier $SA_1$ is obtained on the data buses DB and $\overline{DB}$. Also, at this time, since the transistors $Q_a$ and $Q_b$ are turned ON in response to the high level of the inverted signal $\overline{A}_6$, the potentials of the data buses DB and $\overline{DB}$ are input through these transistors to the output buffer BUF and a read data $D_{out}$ is output. If the selected memory cell $MC_{1,1}$ was storing charges before the reading operation, the data bus DB becomes a high level and the data bus $\overline{DB}$ becomes a low level, then in this case, the read data $D_{out}$ is "1". Conversely, if the selected memory cell $MC_{1,1}$ was not storing a charge, the read data $D_{out}$ is "0".

If the most-significant address signal $A_6$ is "1", a word line, for example, $WL_{65}$ is selected and the potential difference between the bit lines $BL_1$ and $\overline{BL}_1$, generated in accordance with the storing state of the memory cell $MC_{1,65}$ (connected to the word line $WL_{65}$ and the bit line $\overline{BL}_1$), is amplified by the sense amplifier $SA_1$ and is output to the data buses DB and $\overline{DB}$. At this time, since the transistors $Q_c$ and $Q_d$ are turned ON in response to the address signal $A_6$ having a level of "1", the signals on the data buses DB and $\overline{DB}$ are input, with their reversed phases, to the output buffer BUF. Therefore, the reversed-phase data output is output as read out data D out. That is, the same read out data $D_{out}$ can be obtained when the charging states of the memory cells arranged on both sides of the sense amplifiers $SA_1$, $SA_2$, ... are the same. In more detail, if the selected memory cell $MC_{1,65}$ is storing charges before the reading operation, the data bus $\overline{DB}$ becomes a low level and the data bus DB becomes a high level. This high and low level relationship of the data buses DB and $\overline{DB}$ is different from that when the memory cell $MC_{1,1}$, which is storing charges, is selected. Nevertheless, through the transistors $Q_c$ and $Q_d$, the node g becomes high level and the node h becomes low level. Therefore, when the selected memory cell $MC_{1,65}$ is storing charges, the read data $D_{out}$ is "1".

In such a memory device as mentioned above, when the stored data in all of the memory cells is to be cleared, the clamping transistors $Q_{13}$, $Q_{14}$, $Q_{23}$, $Q_{24}$, ... connected to all of the bit lines are turned ON by applying a clear signal CLR to the gates of all clamping transistors, to cause the bit line potentials to become 0 volts. In this state, all the word lines may be selected sequentially by scanning the word address so that transfer gate transistors T along each word line $WL_1$, ..., $WL_{65}$, ... turn on successively and discharge the associated capacitors C. More advantageously, all of the voltages of all of the word lines $WL_1$, ..., $WL_{65}$ may be raised simultaneoysly, to be higher than the threshold voltage Vth of the transfer gate transistor T of each memory cell. This causes all of the charges stored in the capacitors of the respective memory cells MC to be discharged through the respective bit lines and the clamping transistors $Q_{13}$, $Q_{14}$, $Q_{22}$, $Q_{24}$, ... at the same time. Thus, the operation for clearing all of the memory cells MC is carried out.

Figure 2:
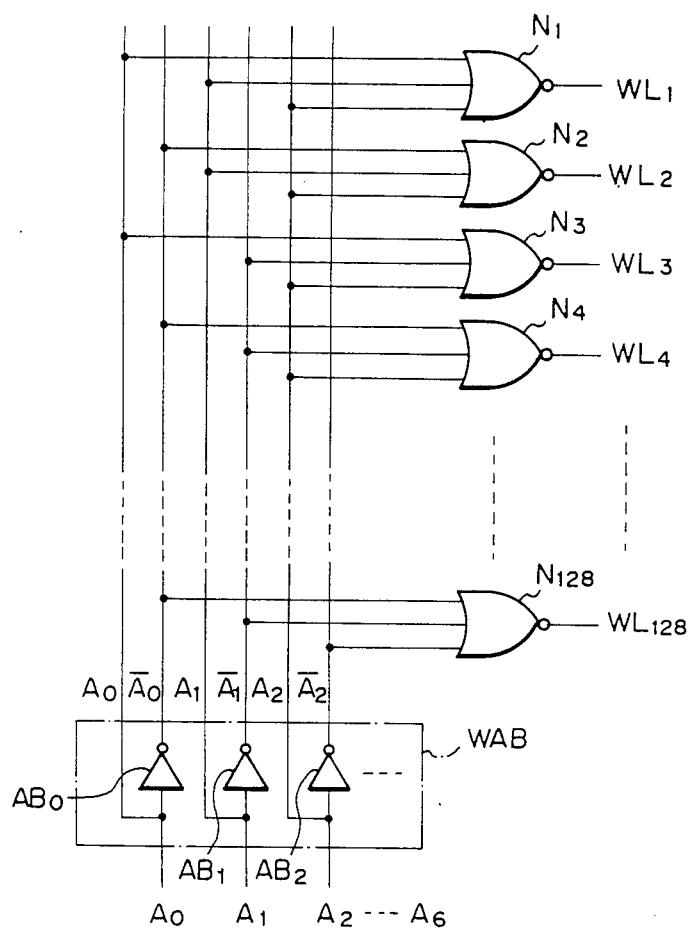
FIG. 2 is a block circuit diagram of the construction of the word decoder used in the device of FIG. 1.

FIG. 2 is an example of the word decoder WD used in the above-mentioned memory device. The word decoder in FIG. 2 has an address buffer unit WAB which includes a plurality of address buffer circuits $AB_0$, $AB_1$, $AB_2$, ... for forming inverted and noninverted signals of the respective address signals $A_0$, $A_1$, $A_2$, ... and $A_6$, and NOR gates $N_1$, $N_2$, $N_3$, ... and $N_{128}$ to which respective outputs of the address buffer unit WAB are selectively input. That is, each NOR gate $N_i$ receives 6 bits of a selected combination of the address signals $A_1$ through $A_6$ and $\overline{A}_1$ through $\overline{A}_6$.

In such a word decoder, in a usual read/write operation, only an output of either one of the NOR gates becomes a high level, and all of the others become a low level, in accordance with the values of the input address signals $A_0$, $A_1$, $A_2$, ... and $A_6$. However, if all of the outputs of the address buffer unit WAB can be made to be a low level, in the same way, all of the outputs of the NOR gates, i.e., the decoded output, can be made to be a high level so that selection of all of the word lines can be effected for clearing all of the memory cells at the same time. An example of a way of clearing all the memory cells is described with reference to FIGS. 3 and 4.

Figure 3:
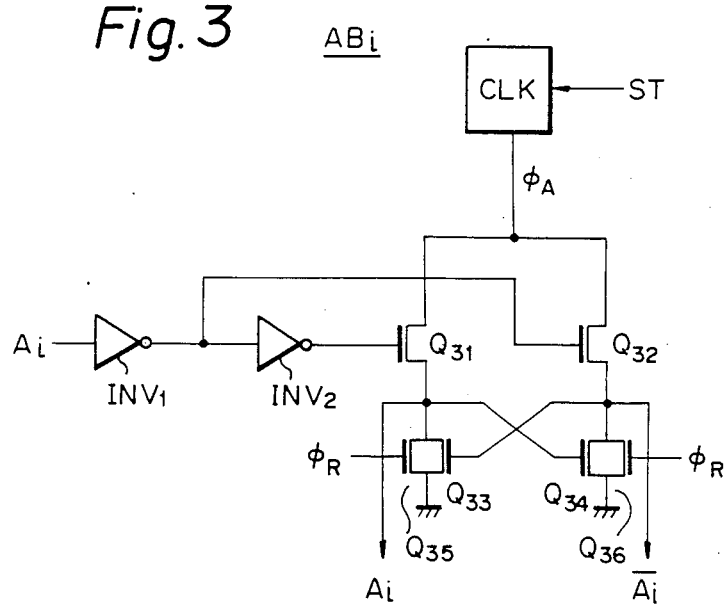
FIG. 3 is a detailed circuit diagram of an address buffer circuit used in the word decoder of FIG. 2.

FIG. 3 is an address buffer circuit $AB_i$ for one bit. The address buffer circuit in the figure. includes inverters $INV_1$ and $INV_2$, transistors $Q_{31}$, $Q_{32}$, $Q_{33}$, $Q_{34}$, $Q_{35}$, and $Q_{36}$, and a clock signal generator CLK. In such an address buffer circuit, to make both of the output address signals $\overline{A}_i$ and $A_i$ a low level, only a reset signal $\phi_R$ need be applied to the gates of the transistors $Q_{35}$ and $Q_{36}$ during a reset interval. The generation of a clock pulse $\phi_A$, which is usually applied from the clock signal generator CLK to the drains of the transistors $Q_{31}$ and $Q_{32}$ during an address selection (active interval) is prohibited by applying a stop signal ST to the clock signal generator CLK.

Figure 4:
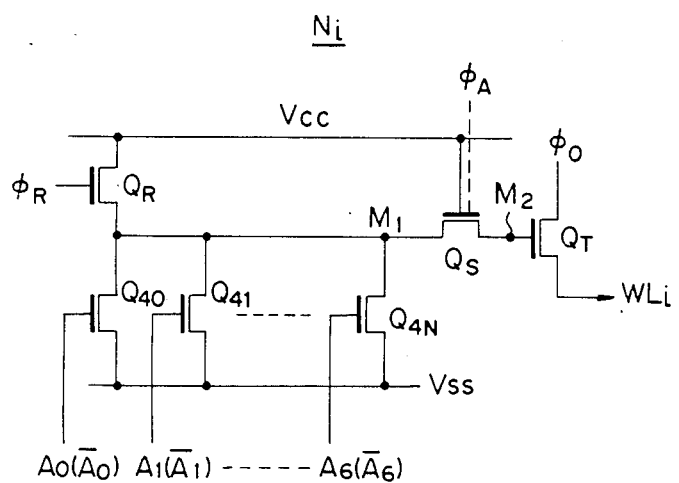
FIG. 4 is a circuit diagram of an example of a NOR gate in the word decoder of FIG. 2.

FIG. 4 is a circuit diagram of each of the NOR gates $N_1$, $N_2$, ... shown in FIG. 2. The NOR gate $N_i$ shown in FIG. 4 includes transistors $Q_{40}$, $Q_{41}$, ..., and $Q_{4N}$ connected in parallel, a reset transistor $Q_R$, a transfer gate transistor $Q_S$, and an output transistor $Q_T$. In such a NOR gate, when the 6-bit address signals (a combination of $A_0$ through $A_6$ and $\overline{A}_0$ through $\overline{A}_6$), usually applied to the gates of the respective transistors $Q_{40}$, $Q_{41}$, ..., and $Q_{4N}$, are all at the low level, all of these transistors $Q_{40}$, $Q_{41}$, ..., and $Q_{4N}$ are turned OFF so that a high-level selection signal $\phi_0$ can be obtained at the word line $WL_i$. Accordingly, by making all of the address signals $A_0$ through $A_6$ and $\overline{A}_0$ through $\overline{A}_6$ to be a low level, all of the word lines $WL_1$ through $WL_{128}$ can be selected at the high level.

It is also possible to realize an all-selection state of the word lines by another method different from the above-mentioned operation in the address buffer unit WAB. To this end, in place of, for example, applying a power supply $V_{CC}$ to the gate of the transfer gate transistor $Q_S$, a clock signal $\phi_A$ may be applied. During a usual read/write operation, the clock signal $\phi_A$ is made to be the high level. To effect the all-selection mode, however, the clock signal $\phi_A$ is made to be a high level during a reset interval so as to make a node $M_2$ between the drain (source) of the transistor $Q_S$ and the gate of the transistor $Q_T$ to be a high level. Before starting the operation of the NOR gates, that is, before applying the address signals $A_0$ ($\overline{A}_0$) through $A_6$ ($\overline{A}_6$) to the NOR gates $N_1$ through $N_{128}$, the clock signal $\phi_A$ is made a low level so that the transistor $Q_S$ is turned OFF. Therefore, the node $M_2$ is maintained at the high level even after the node $M_1$ is turned to the low level. Thus, the output transistor $Q_T$ in each NOR gate $N_i$ is kept ON, resulting in attaining the all-selection state.

As described above, according to the present invention, in a dynamic random access memory, by adding a simple circuit including clamping transistors and an inverting circuit, an operation for clearing all of the bits can be carried out surely and at substantially the same time. Also, during the clearing operation, since it is sufficient to raise the voltages of the word lines to be higher than the threshold voltage of the transfer gate transistor T in each memory cell, it is not necessary to enlarge the driving capability for the word-decoder output for the clearing operation. Therefore, the clearing operation can be effected at a high speed. Further, the power consumption during the clear operation is relatively lowered.

Note that the present invention is not restricted to the above-described embodiment of the present invention. Various changes and modifications are possible without departing from the scope of the present invention. For example, the present invention is applicable to a memory device having a so-called folded bit line construction as disclosed in U.S. Pat. No. 4,025,907 in which each pair of bit lines are extending on one side of the associated sense amplifier in contrast to the open bit line construction of the above-described embodiment.

What is claimed is:

1. A semiconductor memory device operatively connected to receive a clear control signal and input data, and to generate output data, said memory device comprising:

a plurality of bit-line pairs;

a plurality of memory cells operatively connected to respective bit lines of said bit-line pairs;

a plurality of sense amplifiers, operatively connected between said bit-line pairs, each of said sense amplifiers corresponding to one of said bit-line pairs and each having a pair of complementary signal terminals operatively connected to respective bit lines of said corresponding bit-line pairs;

a pair of data buses, operatively connected to said bit-line pairs, for inputting and outputting data to and from a selected bit-line pair;

a data inverting circuit, operatively connected to said pair of data buses, for selectively inverting the input/output data such that the charging states of respective memory cells connected to said bit-line pairs become equal for the same input/output data and for outputting complementary signals; and a clamp circuit, operatively connected to said bit-line pairs, for drawing the potentials of said bit-line pairs to a predetermined potential in response to the clear control signal applied when the contents of all of said memory cells are to be cleared.

2. A semiconductor memory device as set forth in claim 1, wherein each of said memory cells comprises:
a capacitor for storing data; and
an MIS transistor, operatively connected between each of said memory cells and said capacitor, for transferring said data between one of said bit lines and said capacitor, whereby said semiconductor memory device is a dynamic random access memory.

3. A semiconductor memory device as set forth in claim 2, further comprising:
an output buffer circuit, operatively connected to said data inverting circuit, for providing the output data; and
a write-in amplifier, operatively connected to said data inverting circuit, for receiving the input data.

4. A semiconductor memory device as set forth in claim 3, wherein said output buffer circuit includes two input terminals for receiving the complementary signals, said output data being determined in response to the complementary signals, and wherein said write-in amplifier includes two output terminals for providing complementary output signals determined in response to the complementary signals.

5. A semiconductor memory device as set forth in claim 4, wherein said data inverting circuit comprises switching means for connecting said pair of data buses to said two input terminals of said output buffer circuit and to said two output terminals of said write-in amplifier, in one of a cross connection and a straight connection in accordance with a selection of one of said memory cells.

6. A semiconductor memory device as set forth in claim 5, further comprising:
first and second groups of word lines, located adjacent first and second groups of said memory cells, respectively, for selecting first and second groups of said memory cells connected to respective data buses via respective bit lines of said corresponding bit line pairs;
a word decoder, operatively connected to receive address signals and operatively connected to said word lines, for selecting one of said word lines;
wherein said switching means comprises:
a first transistor, operatively connected between said first one of said data buses, and a first one of said inputs of said output buffer circuit and a first one of said outputs of said write-in amplifier;

a second transistor, operatively connected between said second one of said data buses, and a second one of said inputs of said output buffer circuit and a second one of said outputs of said write-in amplifier;

a third transistor, operatively connected between said second one of said data buses, and said first one of said inputs of said output buffer circuit and said first one of said outputs of said write-in amplifier;

a fourth transistor, operatively connected between said first one of said data buses, and said second one of said inputs of said output buses and said second one of said outputs of said write-in amplifier;

said first and second transistors being simultaneously turned ON in response to said address signals when said first group of word lines is selected, and said third and fourth transistors being simultaneously turned ON in response to said address signals when said second group of word lines is selected.

7. A semiconductor memory device as set forth in claim 6, wherein said word decoder comprises word-line simultaneous selecting means, operatively connected to said word lines, for simultaneously raising the potentials of all of said word lines to a higher voltage than the threshold voltage of said MIS transistor when the contents of all of said memory cells are to be cleared.

8. A semiconductor memory device as set forth in claim 7, wherein said word decoder further comprises:
an address buffer unit for forming complementary signals of said address signals; and
a plurality of NOR gates, operatively connected to said address buffer unit, for selectively receiving said complementary signals for selecting one of said word lines;
and wherein said word-line simultaneous selecting means comprises means for making all of the complementary signals a low level, whereby all of the outputs of said NOR gates become a high level.

9. A semiconductor memory device as set forth in claim 7, wherein said word decoder further comprises:
an address buffer unit for forming complementary signals of said address signals; and
a plurality of NOR gates, operatively connected to said address buffer unit, for selectively receiving said complementary signals for selecting one of said word lines;
wherein said word-line simultaneous selecting means includes means for making all of the outputs of said NOR gates a high level.

10. A semiconductor memory device as set forth in claim 7, having a reset interval and an active interval, wherein said word decoder further comprises:
an address buffer unit for forming complementary signals of said address signals; and
a plurality of NOR gates, operatively connected to said address buffer unit, for selectively receiving said complementary signals to select one of said word lines, said NOR gates each having an output transistor;
wherein said word-line simultaneous selecting means includes means for charging up each gate of said output transistor during said reset interval and for disconnecting each gate of said output transistor from the remaining portion of each of said NOR gates.

11. A semiconductor memory device as set forth in claim 2, further comprising:
   a plurality of word lines intersecting said bit-line pairs, said MIS transistor in each of said memory cells having a gate electrode connected to a respective one of said word lines; and
   word-line simultaneous selecting means, operatively connected to said word lines, for simultaneously raising the potentials of all of said word lines to a voltage higher than the threshold voltage of each of said MIS transistors when the contents of all of said memory cells are to be cleared.

12. A semiconductor memory device as set forth in claim 1, wherein said clamp circuit comprises a plurality of clamping transistors, each of said clamping transistors operatively connected between one of said bit lines and ground, said clamping transistors having gate electrodes operatively connected to receive the clear control signal when the contents of all of said memory cells are to be cleared.

* * * * *